United States Patent
Helms et al.

(10) Patent No.: US 7,139,156 B1
(45) Date of Patent: Nov. 21, 2006

(54) NON-PENETRATION OF PERIODIC STRUCTURE TO PM

(75) Inventors: Carl A. Helms, Lafayette, CO (US); Edward Virgil Denison, Erie, CO (US)

(73) Assignee: Storage Technology Corporation, Louisville, CO (US)

( * ) Notice: Subject to any disclaimer, the term of this patent is extended or adjusted under 35 U.S.C. 154(b) by 671 days.

(21) Appl. No.: 10/175,975

(22) Filed: Jun. 20, 2002

(51) Int. Cl.
*G11B 5/33* (2006.01)

(52) U.S. Cl. .............................. 360/327.11; 360/327.1

(58) Field of Classification Search ............ 360/327.1, 360/327.23, 327.2, 327.3, 327.31, 327, 320, 360/327.11
See application file for complete search history.

(56) References Cited

U.S. PATENT DOCUMENTS

| | | | |
|---|---|---|---|
| 3,840,898 A | 10/1974 | Bajorek et al. | 360/327.2 |
| 4,477,794 A | 10/1984 | Nomura et al. | 338/32 R |
| 4,556,925 A * | 12/1985 | Suenaga et al. | 360/327 |
| 4,613,918 A * | 9/1986 | Kanai et al. | 360/320 |
| 4,660,113 A | 4/1987 | Nomura et al. | 360/327 |
| 4,663,683 A | 5/1987 | Youda et al. | 360/327 |
| 5,018,037 A | 5/1991 | Krounbi et al. | 360/327.3 |
| 5,530,608 A | 6/1996 | Aboaf et al. | 360/316 |
| 5,713,122 A | 2/1998 | Aboaf et al. | 29/603.08 |
| 5,745,978 A | 5/1998 | Aboaf et al. | 29/603.08 |
| 5,835,458 A | 11/1998 | Bischel et al. | 369/44.12 |
| 5,949,619 A | 9/1999 | Eckberg et al. | 360/291 |
| 5,969,896 A | 10/1999 | Nakamoto et al. | 360/66 |
| 6,038,106 A | 3/2000 | Aboaf et al. | 360/317 |
| 6,172,859 B1 * | 1/2001 | Watanabe et al. | 360/327.3 |
| 6,278,594 B1 | 8/2001 | Engel et al. | 360/325 |
| 6,449,135 B1 * | 9/2002 | Ding et al. | 360/327.31 |

FOREIGN PATENT DOCUMENTS

EP  1 058 324 A1  12/2000

* cited by examiner

*Primary Examiner*—Tianjie Chen
(74) *Attorney, Agent, or Firm*—Yee & Associates, P.C.

(57) ABSTRACT

A magnetoresistive read head having a corrugated magnetoresistive layer wherein the corrugated section does not encroach on magnetic elements on either end of the magnetoresistive layer. The corrugations in the magnetoresistive layer stabilize the magnetization in the center region of the read head, while the magnetic elements stabilize the magnetization at the ends. By separating the two stabilization methods, unfavorable interactions between them is reduced.

17 Claims, 1 Drawing Sheet

NON-PENETRATION OF PERIODIC STRUCTURE TO PM

BACKGROUND OF THE INVENTION

1. Field of the Invention

The present invention relates to data storage technology, and particularly to devices implementing magnetoresistive read heads.

2. Background of the Invention

In the data storage field, information is stored in many ways. One way includes writing data onto a magnetic tape by selectively magnetizing regions of the tape. The magnetized tape regions produce a magnetic stray field which can be read by a read head located above the tape surface and converted into an electrical signal. A common type of read head for this task is the magnetoresistive (MR) read head.

A common goal in the information storage industry is to magnetically stabilize a magnetoresistive read head such that the generated electric signal is well behaved. This is frequently accomplished by controlling the boundary or end magnetic domains in a MR element. The control is via magnetic exchange tabs or permanent magnets (PM) deposited at the ends of the element. However, the wider the track width is made, the less effective boundary magnetic control is for the center of the element. A recent technique to overcome this limitation is to introduce a periodic perturbation (gratings) of the element shape in the middle of the device which creates a periodic magnetic charge that stabilizes the middle of the MR element. However, the periodic perturbation can interfere with the magnetic field of the PM and bias current flow direction into MR element. This problem is exacerbated by the fact that read elements must continue to decrease in size to keep up with the scaling of other related technologies. As the read heads are made smaller, the relative sizes of regions of magnetization instability in the MR element grow.

The technology of MR read heads would therefore benefit from a way to stabilize magnetization patterns in the read head.

SUMMARY OF THE INVENTION

The present application teaches an improvement to magnetic stabilization of MR read heads. In a preferred sample embodiment, this is done by limiting the undulations of the periodic structure in the MR element to areas not immediately next to or including the PMs at either end of the element.

A known way to take care of the problem of stabilizing the magnetic field is to install permanent magnets (PMs) on opposite sides of the MR element. This stabilizes the magnetization near the ends of the element.

Later, corrugated or periodic structure in the MR element itself was introduced, in order to stabilize the magnetic field in the regions between the PMs. This was best used in wide structures, because where the grating nears the PMs, large perturbations in the magnetization from the preferred configuration may result.

As MR heads shrink in size, the technique of putting a periodic structure in the MR element is less useful, because the relative sizes of the regions of interaction between the demagnetization magnetic fields of the grating and the PMs is increased.

In the present invention, the periodic structure of the MR element is used but limited to regions that are not directly adjacent to the PMs at either end of the element. This allows for the PMs to stabilize the magnetization near the ends of the MR element, and allows the periodic structure to stabilize the magnetic field in the middle region of the MR element without perturbing the magnetic field origination from the PMs.

In an example embodiment, by terminating the periodic structure before it encroaches in the MR boundary or end region where the PMs have been deposited, simultaneous stabilization of both the ends and the center of the MR element can be accomplished.

In preferred embodiments, the magnets formed on the read head are not contiguous with the section of the magnetoresistive layer having the grating or periodic structure. The permanent magnet layers preferably do not cover any of the gratings in the structure of the magnetoresistive layer. The edges of the magnets preferably begin just past the last lines of the grating structure. Of course, this distance can vary, from the permanent magnets beginning very close to the end of the grating, or a small distance can separate the grating from the magnet.

The present innovation offers the advantage of allowing control of unwanted domain activity over a wide range of MR track widths.

Though the detailed description depicts embodiments having permanent magnets at the ends of the magnetoresistive layer, magnetic exchange tabs or other types of magnetic elements can be used consistent with the present innovations. The type of magnetic element used is not intended to be a limiting factor; rather the relative placement of the magnetic elements and the grating of the magnetoresistive structure more clearly depicts the present innovations.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

The present innovations are described with reference to the several figures. The described embodiments and implementations teach the present innovations by way of example only, and are not intended to limit the scope of the invention to the exact embodiments, dimensions, or methods described.

Figure 1:
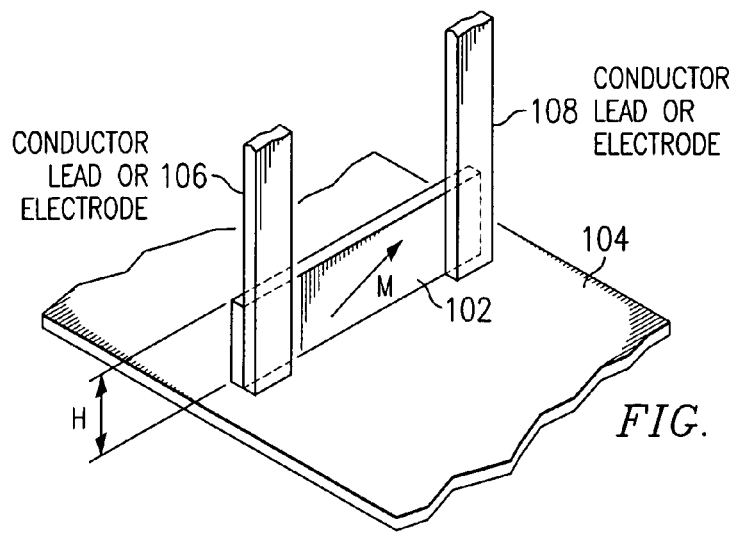
FIG. 1 shows a magnetic read head and a recording medium consistent with implementation in a preferred embodiment.

FIG. 1 shows a general setup for a read head and magnetic media. The read head 102 uses the magnetoresistance effect to read data from the recording medium 104 by detecting changes in the resistance between two electrodes (or conductor leads) 106, 108 caused by changes in the recording medium magnetization. As the magnetized material passes near the read head, the magnetic field arising from the recording medium changes the magnetization of the magnetoresistive material in the read head, causing the resistance between the electrodes to change. This change is typically measured as a voltage change.

A way to increase the amount of information recorded in an area of recording medium is to increase the number of side by side tracks containing recorded information, by decreasing the width of each of them. To detect the data in a track, the read head therefore should preferably be narrow (i.e., be short along the "H" dimension in FIG. 1) so as to experience the magnetic field from the recorded data in a single track.

To ensure proper and consistent operation of MR heads, unwanted domain activity must be suppressed. This must be accomplished for a wide range of track widths or Tracks per Inch (TPI). This means that the MR track width could vary from product to product while the need to maintain stable head operation remains. The current technique allows control of unwanted domain activity to be attempted over a wide range of MR track widths.

Figure 2:
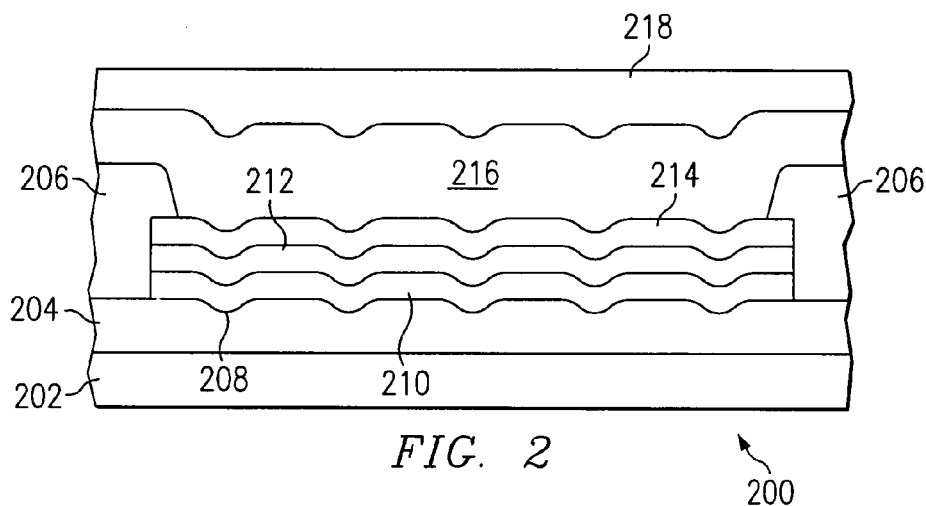
FIG. 2 shows a sectional view of an innovative read head structure according to a preferred embodiment.

A preferred embodiment of the present invention is shown in FIG. 2. This figure shows a cutaway view of the magnetoresistive read head consistent with a preferred embodiment. Though the following structure is recited with particular dimensions and materials, this description is intended as an example only. Other dimension and materials can of course be used within the contemplation of the present innovations.

At the bottom of the shown structure 200 is one of two magnetic shields 202. These are typically highly permeable magnetic shields that help focus the magnetic fields from the disk and help eliminate stray fields. In a preferred embodiment, the magnetic shield is made from a cobalt-zirconium tantalium alloy (CZT) and is about 2.5 micron thick.

Above the bottom magnetic shield 202 is a first gap layer 204, made of aluminum oxide and about 1100 angstroms thick in a preferred embodiment. This layer forms the substrate upon which the magnetoresistive element is formed, and upon which the permanent magnets 206 are placed. The permanent magnets 206 are shown at either end of the structure.

Within the MR element itself are shown three layers 210, 212, 214. The first layer 210 is formed from a cobalt zirconium molybdenum alloy (CZM) and is typically about 250 angstroms thick. This layer serves to create a magnetic field in the MR or NiFe layer and thus allows quasi-linear magnetic field (from the medium) to voltage device operation to occur.

Above this layer is a spacer layer. This layer is preferably made from tantalum and is about 80 angstroms thick. This layer serves to prevent direct contact between the magnetic first layer and the magnetic third layer or the magnetoresistive layer.

Above the spacer layer 212 is formed the third layer 214 of the MR element. This layer 214 is preferably comprised of a nickel iron alloy and is about 320 angstroms thick. This layer serves to create the magnetoresistive response which converts detected magnetic field changes to resistance or voltage changes.

Above the MR element is formed a final gap layer 216. This layer is preferably comprised of alumina as was the first gap layer. Gap layer 216 is preferably formed at about 1500 angstroms thickness. The gap layer 216 covers both the MR element and the PMs at either end of the MR element.

Above the second gap layer is the top magnetic shield 218. This shield 218 is preferably comprised of CZT, as is the bottom magnetic shield, and is about 2.5 micron thick. Top shield 218 works with bottom shield 202 to block stray magnetic fields.

FIG. 2 shows that the MR element is not planar shaped, but has undulations 208 built into it, forming a periodic structure on the surface of the element. These periodic perturbations 208 to the surface structure help to stabilize the magnetization in the interior region of the MR read head.

Forming the periodic structure in the whole length of the MR element, as has been done heretofore, causes boundary irregularity problems on the ends of the MR element. The combined magnetic fields of the PMs and the periodic structure interfere, causing non-optimum magnetic fields in direction and magnitude near the PM to MR element boundary and possibly causing undesirable structural and magnetic property changes in the PM material near the boundary.

The present innovations teach that these problems are alleviated by limiting the region of the periodic structure in the MR element to areas that are not directly adjacent to the PMs. This allows simultaneous stabilization of both the end regions and the center region of the MR element.

The periodic topography of the MR element shown in FIG. 2 are preferably formed by photolithographic and iron milling means.

Figure 3:
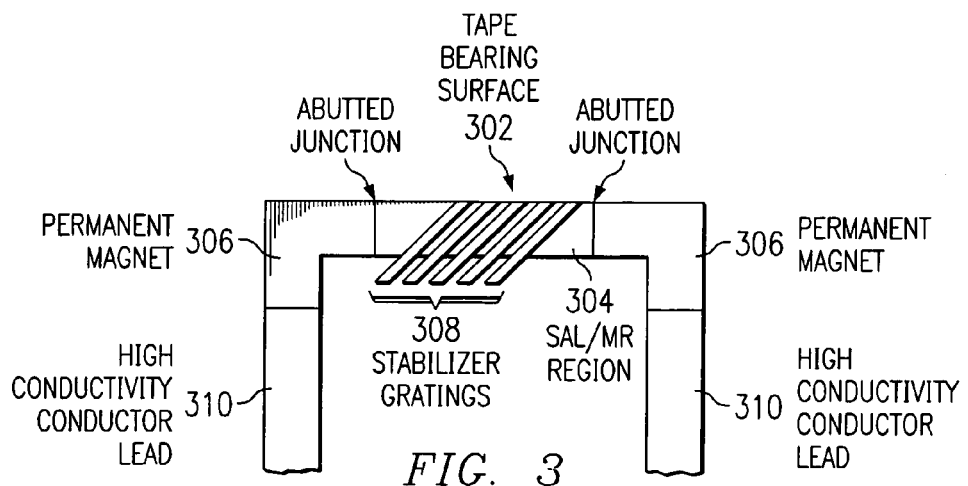
FIG. 3 shows a planar view of the innovative read head structure according to a preferred embodiment as in FIG. 2 but with the magnetic field shielding components not drawn for clarity.

FIG. 3 shows a planar view of a preferred embodiment, with the magnetic shields removed for clarity. In this example embodiment, the non-penetration of the periodic grating structure into the PM region is clearly seen.

In this example embodiment, the tape bearing surface 302 is part of the SAL/MR region 304. Permanent magnets 306 abut the SAL/MR region at junctions. The stabilizer grating 308 is located in the SAL/MR region 304 as well, between the PMs 306 and not encroaching beneath them. High conductivity leads 310 are also shown to provide power to the device.

What is claimed is:

1. A read head structure, comprising:
   a magnetoresistive element deposited on a substrate, the magnetoresistive element having a grating region on at least one surface of the magnetoresistive element;
   a first magnetic element formed at a first end of the magnetoresistive element, the first magnetic element terminating before it encroaches on the grating region of the magnetoresistive element.

2. The read head structure of claim 1, further comprising a second magnetic element formed at a second end of the magnetoresistive element, the second magnetic element terminating before it encroaches on the grating region of the magnetoresistive element.

3. The read head structure of claim 1, wherein the first magnetic element is a permanent magnet.

4. The read head structure of claim 1, wherein the magnetoresistive element comprises a first layer, a second magnetoresistive layer, and a third layer.

5. A read head, comprising:
   a substrate;
   a magnetoresistive element deposited on a region of the substrate;
   a first magnetic element positioned at a first end of the region;
   a second magnetic element positioned at a second end of the region;
   wherein the magnetoresistive element comprises a topographic section and a flat section; and
   wherein the first and second magnetic elements are formed on the flat section and not on the topographic section of the magnetoresistive element.

6. The read head of claim 5, wherein the first magnetic element is a permanent magnet.

7. The read head of claim 5, wherein the first magnetic element is a magnetic exchange tab.

8. The read head of claim 5, wherein the magnetoresistive element comprises a first layer, a second magnetoresistive layer, and a third layer.

9. A read head, comprising:
a substrate, having a magnetoresistive element formed thereon, wherein the magnetoresistive element has a grating pattern formed on a section of at least one surface of the magnetoresistive element;
a first magnetic element formed at a first end of the magnetoresistive element;
wherein the first magnetic element is not contiguous with the section of the magnetoresistive element.

10. The read head of claim 9, further comprising a second magnetic element formed at a second end of the magnetoresistive element, and wherein the second magnetic element is not contiguous with the section of the magnetoresistive element.

11. The read head of claim 9, wherein the first magnetic element is a permanent magnet.

12. The read head of claim 9, wherein the magnetoresistive element comprises a plurality of layers, at least one of which is a magnetoresistive layer.

13. A method of manufacturing a magnetoresistive head for reading a magnetic media, said method comprising the steps of:
forming a magnetoresistive element on a substrate, the magnetoresistive element having a corrugated section between first and second ends of the magnetoresistive element;
forming a first magnetic element at the first end of the magnetoresistive element outside the corrugated section; and
forming a second magnetic element at the second end of the magnetoresistive element outside the corrugated section.

14. The method of claim 13, wherein the first magnetic element is a permanent magnet.

15. The method of claim 13, wherein the magnetoresistive element comprises a magnetoresistive layer between two substantially non-magnetoresistive layers.

16. A magnetoresistive read head, comprising:
means for stabilizing a magnetic field in a first region of a read head;
means for stabilizing a magnetic field in a second region of the read bead;
means for stabilizing a magnetic field in a third region of the read head;
wherein the second region is between the first and third regions, and wherein the regions are spatially separate.

17. The read head of claim 16, wherein the means for stabilizing the second region comprises a corrugated structure in a magnetoresistive layer in the second region, and the means for stabilizing the first and third regions comprise permanent magnets positioned at either end of the second region.

* * * * *